United States Patent [19]

Hornback et al.

[11] Patent Number: 5,128,749
[45] Date of Patent: Jul. 7, 1992

[54] FUSED HIGH DENSITY MULTI-LAYER INTEGRATED CIRCUIT MODULE

[75] Inventors: William B. Hornback, Newport Beach; Wei H. Koh, Irvine, both of Calif.

[73] Assignee: Grumman Aerospace Corporation, Bethpage, N.Y.

[21] Appl. No.: 681,775

[22] Filed: Apr. 8, 1991

[51] Int. Cl.⁵ .................. H01L 23/12; H01L 23/14
[52] U.S. Cl. ................................ 357/80; 357/75; 357/74
[58] Field of Search ............... 174/258, 259, 256, 260; 361/414; 357/71, 80, 75, 74; 428/210, 246, 901; 250/370.14

[56] References Cited

U.S. PATENT DOCUMENTS

| | | | |
|---|---|---|---|
| 3,400,210 | 9/1968 | Retmer | 174/266 |
| 3,436,604 | 4/1969 | Hyltin et al. | 357/40 |
| 3,829,356 | 8/1974 | Rutt | 174/258 |
| 4,304,624 | 12/1981 | Carson et al. | 156/630 |
| 4,320,438 | 3/1982 | Ibrahim et al. | 361/401 |
| 4,352,715 | 10/1982 | Carson et al. | 156/634 |
| 4,354,107 | 10/1982 | Carson et al. | 250/239 |
| 4,361,717 | 11/1982 | Gilmore et al. | 136/246 |
| 4,371,744 | 2/1983 | Badet et al. | 174/68.5 |
| 4,403,238 | 9/1983 | Clark | 357/30 |
| 4,423,468 | 12/1983 | Gatto et al. | 361/404 |
| 4,525,921 | 7/1985 | Carson et al. | 29/577 |
| 4,551,629 | 11/1985 | Carson et al. | 250/578 |
| 4,659,931 | 4/1987 | Schmitz et al. | 250/338 |
| 4,670,770 | 6/1987 | Tai | 357/60 |
| 4,712,161 | 12/1987 | Pryor et al. | 361/411 |
| 4,794,092 | 12/1988 | Solomon | 437/208 |
| 4,797,715 | 1/1989 | Thillays et al. | 357/17 |
| 4,851,615 | 7/1989 | Butt | 361/414 |
| 4,931,906 | 6/1990 | Reifel et al. | 361/414 |

Primary Examiner—William Mintel
Assistant Examiner—S. V. Clark
Attorney, Agent, or Firm—Stetina and Brunda

[57] ABSTRACT

A fused high density multi-layered integrated circuit module for integrating infrared detector arrays to signal conditioning circuits is disclosed. The module comprises a plurality of thin film substrate layers disposed in substantially overlapping registry to form a non-conductive supporting body, a plurality of the layers have electronic devices mounted thereon. A plurality of detector element connectors are formed along a first edge portion of the body. Conductive conduits are formed upon a plurality of the layers. The conductive conduits have first portions which interconnect the detector element connectors to the electronic devices disposed upon the layers of the body. The conductive conduits also have second portions formed upon the surface of said layers and extending to the second edge portion thereof for communicating signals between the electronic devices and external electronics. A glass binding material adhesively attaches adjacent substrate layers together. The glass binding material has a coefficient of expansion approximately equal to the coefficient of expansion of the substrate layers such that thermal stress is reduced and the need for a buffer board is consequently eliminated.

7 Claims, 2 Drawing Sheets

FUSED HIGH DENSITY MULTI-LAYER INTEGRATED CIRCUIT MODULE

FIELD OF THE INVENTION

The present invention relates generally to multi-layer integrated circuit modules and more particularly to a fused high density multi-layer integrated circuit module for integrating infrared detector arrays to signal conditioning electronics.

BACKGROUND OF THE INVENTION

The infrared spectrum covers a range of wavelengths longer than the visible wavelengths but shorter than microwave wavelengths. Visible wavelengths are generally regarded as between 0.4 and 0.75 micrometers. The near infrared wavelengths extend from 0.75 micrometers to 10 micrometers. The far infrared wavelengths cover the range from approximately 10 micrometers to 1 millimeter. The function of infrared detectors is to respond to energy of a wavelength within some particular portion of the infrared region.

Heated objects will dissipate thermal energy having characteristic wavelengths within the infrared spectrum. Different levels of thermal energy, corresponding to different sources of heat, are characterized by the emission of signals within different portions of the infrared frequency spectrum. No single detector is uniformly efficient over the entire infrared frequency spectrum. Thus, detectors are selected in accordance with their sensitivity in the range of interest to the designer. Similarly, electronic circuitry that receives and processes the signals from the infrared detector must also be selected in view of the intended detection function.

A variety of different types of infrared detectors have been proposed in the art since the first crude infrared detector was constructed in the early 1800's. Virtually all contemporary infrared detectors are solid state devices constructed of materials that respond to infrared frequency energy in one of several ways. Thermal detectors respond to infrared frequency energy by absorbing energy, thus causing an increase in the temperature of the detecting material. The increased temperature in turn causes some other property of the material, such as resistivity, to change. By measuring this change the infrared radiation is measured.

Photo-type detectors (e.g., photoconductive and photovoltaic detectors) absorb the infrared frequency energy directly into the electronic structure of the material, inducing an electronic transition which, in turn, leads to either a change in the electrical conductivity (photodetectors) or to the generation of an output voltage across the terminals of the detector (photovoltaic detectors). The precise change that is effected is a function of various factors including the particular detector material selected, the doping density of that material and the detector area.

By the late 1800's, infrared detectors had been developed that could detect the heat from an animal at one quarter of a mile. The introduction of focusing lenses constructed of materials transparent to infrared frequency energy, advances in semiconductor materials and highly sensitive electronic circuitry have advanced the performance of contemporary infrared detectors close to the ideal photon limit.

Current infrared detection systems incorporate arrays of large numbers of discrete, highly sensitive detector elements, the outputs of which are connected to sophisticated processing circuitry. By rapidly analyzing the pattern and sequence of detector element excitation, the processing circuitry can identify and monitor sources of infrared radiation. Though the theoretical performance of such systems is satisfactory for many applications, it is difficult to actually construct structures that mate a million or more detector elements and associated circuitry in a reliable and practical manner. Consequently, practical applications for contemporary infrared detection systems have necessitated that further advances be made in areas such as miniaturization of the detector array and accompanying circuitry, minimization of noise intermixed with the electrical signal generated by the detector elements, and improvements in the reliability and economical production of the detector array and accompanying circuitry.

A contemporary subarray of detectors may, for example, contain 256 detectors on a side, or a total of 65,536 detectors, the size of each square detector being approximately 0.0035 inches on a side with 0.0005 inches spacing between detectors. The total width of such a subarray would therefore be 1.024 inches on a side. Thus, interconnection of such a subarray to processing circuitry requires a connective module with sufficient circuitry to connect each of the 65,536 detectors to processing circuitry within a square a little more than one inch on a side. The subarrays may, in turn, be joined to form an array that includes 25 million detectors or more. Considerable difficulties are presented in aligning the detector elements with conductors on the connecting module and in isolating adjacent conductors in such a dense environment.

The outputs of the detectors must undergo a series of processing steps in order to permit derivation of the desired information. The more fundamental processing steps include preamplification, tuned bandpass filtering, clutter and background rejection, multiplexing and fixed noise pattern suppression. By providing a detector connecting module that performs at least a portion of the signal processing functions within the module, i.e. on integrated circuit chips disposed adjacent the detector focal plane, the signal from each detector need be transmitted only a short distance before processing. As a consequence of such on-focal plane or "up front" signal processing, reductions in size, power, and cost of the main processor may be achieved. Moreover, up front signal processing helps alleviate performance, reliability, and economic problems associated with the construction of millions of closely spaced conductors connecting each detector element to the main signal processing network.

In order to exploit the advantages of on-focal plane processing of the input signals, it is desirable to provide a detector module that can provide the necessary interconnections between various module processors as well as between module processors and external electronics, with a minimum of wiring congestion and using a minimum of module space, thereby reserving additional module space for on-focal plane processing. The present invention provides an improved method and apparatus to achieve such a result.

In the prior art, a number of detector array modules have been proposed for coupling an array of closely spaced detectors to processing circuitry. Such modules are typically formed such that all connections to and from the module are disposed on a first horizontal layer, with electronic devices and connecting circuitry disposed within the module on one of several stacked horizontal layers interconnected by vertical conductors, known as vias, extending through the layers. A principal shortcoming of those constructions is that a single layer is unduly congested with connections to all detectors and external electronics and must also support a large number of vias extending to the parallel layers. The number of detector elements that may be connected as well as the number of connectors to external electronics that support on-focal plane processors are thereby limited by the size of the connecting layer and the minimum width and spacing of the conductors. Moreover, where the connecting layer becomes overly congested with conductors the electronic devices must be formed on a different layer, requiring conductive vias which further congest the module layers, adding weight and cost to the module and introducing potential performance problems.

Other modules proposed in the prior art address the congestion and space optimization problem by orienting the detector array perpendicular to the plane of the module layers, adjacent to one edge of the module. Such constructions, commonly referred to as "Z-technology architectures", are disclosed in U.S. Pat. No. 3,970,990 to Carson, assigned to the common assignee, and U.S. Pat. No. 4,304,624 to Carson, et al. Z-technology modules are typically formed by stacking multiple layers of thin film substrates and bump bonding an end of each layer to an adjacent row of the detector array. Conductors extending along the surface of the substrates have end portions that are carefully aligned to contact leads from the individual detector elements. Such constructions advantageously avoid wiring congestion associated with connecting all detectors to a single module layer and reduce the accompanying need for vertical vias that detract from the usable space with the module.

One such high density multi-layer integrated circuit module is described in U.S. Pat. No. 4,659,931 issued to Schmitz, et al., the entire disclosure of which is hereby incorporated by reference. The Schmitz module is used for integrating a plurality of detector arrays disposed in the direction normal to the plane of the micro circuits, i.e. the Z-direction. The detector arrays have pixels which are typically less than 100 microns apart and are integrated to the modules by flip-chip bump bonding. To maintain an interconnect directly behind each pixel in the Z-direction, the module layers must be kept very thin, usually less than the pixel center-to-center spacing. The layers, which are ceramic substrates having thin film micro circuits printed thereupon, are laminated using extremely thin thermosetting adhesive sheets. A principal shortcoming to this laminated multi-layer assembly is the poor dimensional stability that exists due to a mismatch of the coefficients of expansion between the ceramic layers and the thermoset adhesive sheets. Typically, the thermosetting adhesives have a coefficient of expansion which is five to ten times that of the alumina ceramic layers. Furthermore, the infrared detectors often operate at orogenic temperatures, thus subjecting the module to large range of thermal cycling and stress. Such wide ranges in the temperature environment can thus cause degradation of the detector to module electrical interconnect, thus leading to a gradual loss of operational performance. When very thin detectors are used, the thermal stress is transmitted from the module to the detectors and can cause the fragile infrared detector arrays to crack.

To alleviate this problem, the prior art has provided a thermal-stress barrier, commonly known as a buffer board, which must be used to absorb the thermal stress from the module. The buffer board is placed between the infrared detector arrays and the module and thus provides for electrical and mechanical interconnection therebetween. Thus, the use of a buffer board adds to the component and processing costs, reduces the interconnect yield, and complicates the array alignment process during integration.

The coefficient of expansion mismatch between the substrate layers and the thermosetting adhesive, as well as the problem of non-uniformity in the thickness of the laminating adhesives, limits the number of layers that can be assembled in a single module stack. The more layers provided in a single module stack, the greater the absolute error in the stacking height which must thus be accounted for. Consequently, larger tolerances must be provided for in the buffer board electrical interconnection. Thus, the large dimensional tolerances required in the laminated modules has prevented the precision stacking of a large number of layers to form higher level focal planes.

Other inherent deficiencies found in the prior art adhesively laminated module assemblies include poor mechanical strength, lack of stiffness, outgassing, moisture absorbance, and poor resistance to chemicals and solvents.

Thus, it would be desirable to provide a high density multi-layer integrated circuit module for integrating infrared detector arrays to signal processing circuits wherein the coefficient of expansion of the module is substantially uniform throughout and approximately equal to that of the infrared detector arrays such that a buffer board would not be required. Additionally, it would be desirable to eliminate the non-uniformities in the thickness of the laminating adhesives to reduce the dimensional tolerances required in the fabrication of the infrared detector array interconnects. Furthermore, it would be desirable to provide a module having improved mechanical strength; greater stiffness; less outgassing; and better moisture, chemical and solvent resistance.

SUMMARY OF THE INVENTION

The present invention specifically addresses and alleviates the above-mentioned deficiencies associated in the prior art. More particularly, the present invention comprises a fused high density multi-layer integrated circuit module for integrating infrared detector arrays to signal conditioning circuits and the like. The module comprises a plurality of thin substrate layers disposed in substantially overlapping registry to form a non-conductive supporting body, a plurality of the layers have electronic devices or signal conditioning electronics mounted thereon. A plurality of first or detector element connectors are formed along a first edge portion of the body. Conductive conduits may be formed upon a plurality of the layers. The conductive conduits have first portions which interconnect the detector element connectors to the electronic devices or signal conditioning electronics disposed upon the layers of the body. The conductive conduits also have second portions extending to a second edge portion of the body where second connectors are formed for communicating signals between the electronic devices and external circuitry. A glass binding material is disposed intermediate the substrate layers and adhesively attaches adjacent substrate layers together. The glass binding material has a thermal coefficient of expansion approximately equal to the thermal coefficient of expansion of the substrate layers such that thermal stress is reduced and the need for a buffer board is eliminated.

The glass binding material has a melting point between 400–550 degrees centigrade such that it may be fused to the adjacent substrate layers without causing damage to the module. The glass binding material bonds adjacent substrate layers utilizing firing durations of less than twenty minutes. This permits the use of thin film micro circuits comprising such materials as sputtered gold to be used without being degraded in the fusing process. In general, firing temperatures must be less than 800 degrees centigrade to avoid damaging thin film microcircuits.

The glass material can be applied to the layers in a tape, sheet, or paste form. The tape or sheet may be applied using a pressing or roller coating apparatus. The paste form may be applied by either printing or spraying.

Low melting point glass binding materials include a high lead-borosilicate glass frit with a thermal coefficient of expansion of 8.4 micron/meter/degree centigrade and a lead-borosilicate glass frit with a thermal coefficient of expansion of 7 micron/meter/degree centigrade. Additionally, other glass sealing materials are known by those skilled in the art to be suitable. Thermal expansion coefficients of between 6.5 and 9 are generally considered suitable.

The thin substrate layers are preferably comprised of an alumina ceramic material, although those skilled in the art will recognize that other materials, e.g. sapphire and polycrystaline silicon, are likewise suitable.

Modules using the glass fusion method of the present invention have a more uniform, stress-free structure due to better material uniformity, better surface bonding, and more complete elimination of strain during the firing process. Modules produced in this way have a better dimensional uniformity and stability which allows for the ability to assemble a module having larger numbers of layers. In higher level (greater number of layers), precision focal plane stacking, the cost will also be reduced due to the need for less kitting. Kitting is reduced due to the higher yields experienced during assembly when using components, i.e. the fused high density multi-layer integrated circuit module of the present invention, having greater uniformity and improved reliability.

In addition to the above-mentioned advantages, the glass fused assemblies also have higher mechanical strength and stiffness, greatly reduced outgassing, and better resistance to chemicals and solvents, a substantially longer performance life and higher reliability can therefore be expected The elimination of the buffer board further reduces the module cost and improves the detector integration yield due to a more direct interconnection and a simplified alignment process.

The fused module assembly of the present invention can thus be used for direct hybridization of a wide variety of detector arrays in the Z-direction without the use of a thermal or mechanical barrier device or buffer board. The detector arrays can include Si, Ge, HgCdTe, PtSi, InSb, and InAs, as well as others.

The fused module assembly of the present invention can also be used as a high density electronic hybrid package for other types of integrated circuits for hermetic or space applications. Of particular interest are applications in RF (radio frequency) packaging as tuned structures for microwave and millimeter wave monolithic integrated circuit packages.

DETAILED DESCRIPTION OF THE PREFERRED EMBODIMENT

The detailed description set forth below in connection with the appended drawings is intended merely as a description of the presently preferred embodiment of the invention, and is not intended to represent the only form in which the present invention may be constructed or utilized. The description sets forth the functions and sequence of steps for construction and implementation of the invention in connection with the illustrated embodiments. It is to be understood, however, that the same or equivalent functions and sequences may be accomplished by different embodiments that are also intended to be encompassed within the spirit and scope of the invention.

Figure 1:
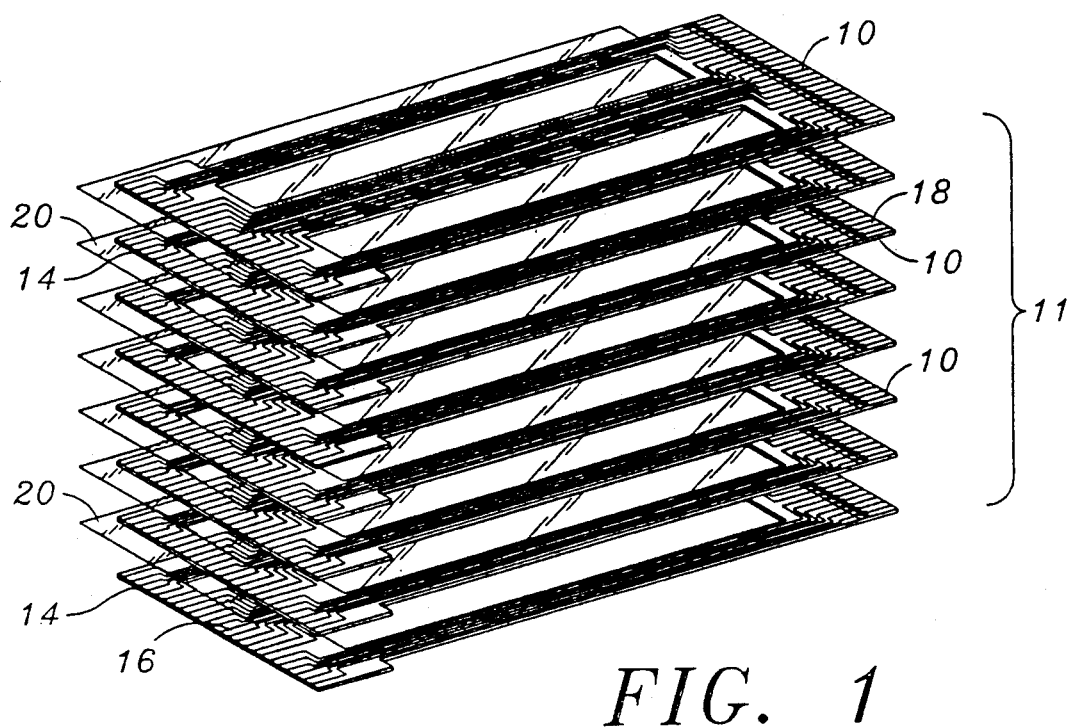
FIG. 1 is an exploded perspective view of a fused high density multi-layered integrated circuit module of the present invention showing the thin film substrate layers and the glass binding material disposed therebetween.
Figure 2:
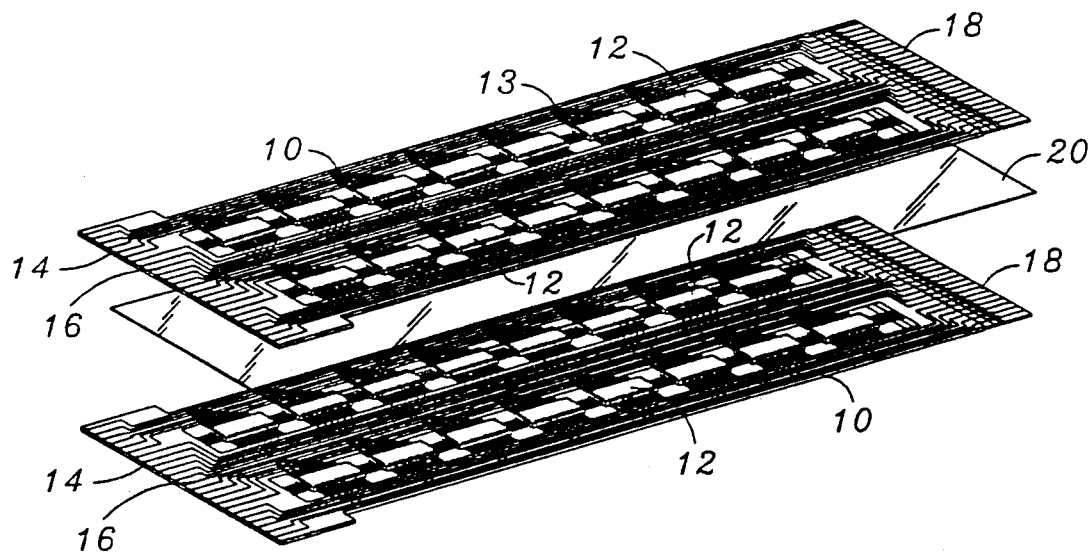
FIG. 2 is an enlarged exploded perspective view of two of the substrate layers and one of the glass binding material layers of FIG. 1 also showing electronic devices disposed upon each of the two substrate layers.
Figure 3:
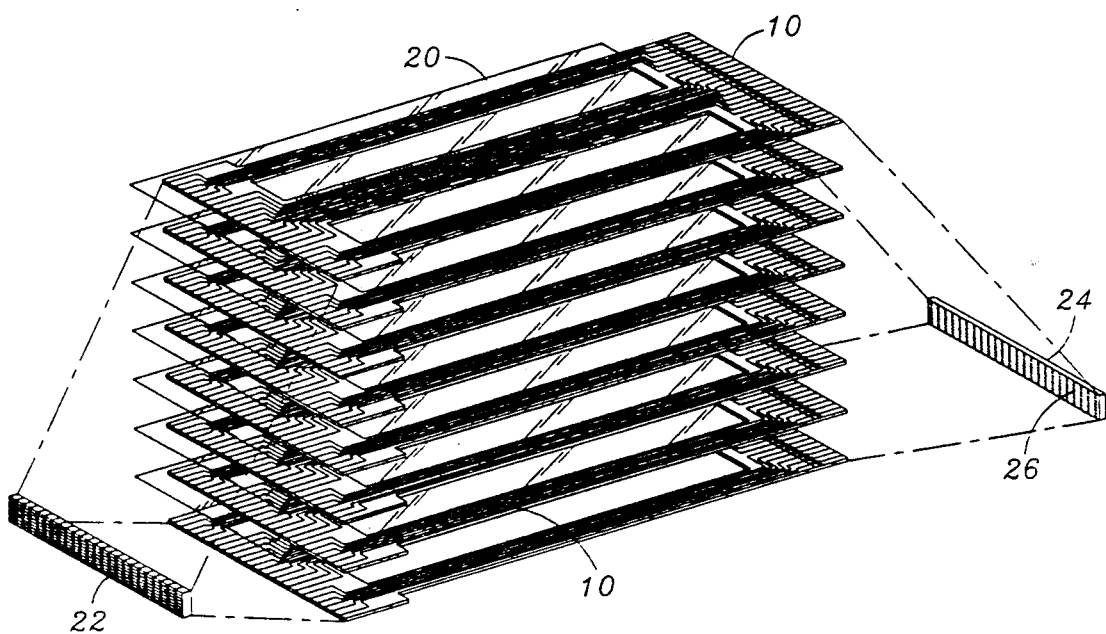
FIG. 3 is an exploded perspective view of the substrate layers and glass binding material layers of FIG. 1 also showing an infrared detector array positioned for attachment to one edge of the module and a flip-chip bump bond connector for attachment to the opposite edge thereof.
Figure 4:
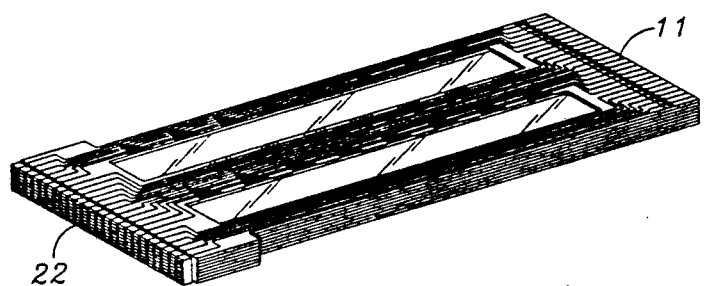
FIG. 4 is a perspective view of the body having an infrared detector array attached thereto.

The fused high density multi-layered integrated circuit module of the present invention is illustrated in FIGS. 1–4 which depict a presently preferred embodiment of the invention. Referring now to FIGS. 1–4, the module is comprised generally of a plurality of thin substrate layers 10 disposed in substantially overlapping registry to form a non-conductive supporting body 11. A plurality of the substrate layers 10 have electronic devices 12 mounted thereon and interconnected by conductive conduits or traces 13 formed upon the surface thereof. A first portion 16 of conductive conduits connects the electronic devices 12 to detector element connectors 14 along one edge of the body 11 such that an array of infrared detector elements 22 may be flip-chip bump bonded thereto. A second portion 18 of the conductive conduits interconnects the electronic devices 12 to external electronic circuitry.

A dielectric or glass binding material layer 20 disposed intermediate the substrate layers 10 has a melting point between 400–550 degrees centigrade and also has a thermal coefficient of expansion approximately equal to the thermal coefficient of expansion of the substrate layers 10. Preferably, the infrared detector element array 22 will have a similar thermal coefficient of expansion. The dielectric layer 20 may be comprised of relatively low melting temperature dielectric materials such as lead borosilicate glass, glass-rich ceramics, green ceramics, or lead borate glass. The dielectric layer may be in the form of tape or paste. The substrate layers may be ground to a desired thickness prior to disposing the dielectric therebetween.

A flip-chip bump bond connector 24 (as shown in FIG. having an array of contact bumps 26 formed thereon may be used to connect the fused high density multi-layered integrated circuit module of the present invention to external circuitry. Furthermore, a plurality of such modules may be stacked and aligned to form a focal plane array. i5 Thus, an improved means for attaching an infrared detector array 22 to an integrated circuit module comprised of a stacked layer of thin film substrates is provided. The replacement of thermoset adhesives by a low melting temperature glass binding material which is fusible in the relatively low temperature range of 400-550 degrees centigrade thus eliminates requirement for a separate detector buffer board and thereby simplifies the integration process.

The glass binding material used in the present invention must be capable of bonding the substrate layers together when heated to less than 800 degrees centigrade. Very short firing duration, typically less than twenty minutes, are preferred. It is necessary to limit the temperature and duration of the firing process to insure that the thin film microcircuits formed upon the substrate layer are not damaged thereby Such microcircuits are often formed of sputtered gold and are subject to degradation if exposed to temperatures in excess of 800 degrees centigrade for more than twenty minutes. Such degradation of the microcircuits would impair their electrical functionality. It is also possible that the structural integrity of the substrate layer could be comprised.

The use of glass materials having thermal expansion coefficients closely matching that of the ceramic thin film substrates and infrared detector array substantially reduce internal thermal stress incurred during the cryogenic cooling required for infrared detector array operation. Therefore, the fused high density multi-layered integrated circuit modules of the present invention are subjected to very little internal stress and improve dimensional stability is achieved. In the preferred embodiment of the present invention such glass binding materials as high lead-borosilicate glass frit having a thermal expansion of 8.4 microns/meter/degrees centigrade and lead-borosilicate glass frit with a thermal expansion of 7 microns/meter/degrees centigrade are preferred. However, those skilled in the art will recognize that other glass materials having thermal coefficients of expansion approximately equal to that of the ceramic substrate and having melting temperatures less than approximately 800 degrees centigrade are likewise suitable.

Furthermore, glass binding layers can typically be formed to more uniform and precise thickness than thermosetting adhesives layer. Thus, less absolute error occurs in the placement of adjacent substrate layers as they are stacked when using glass binding layers instead of thermoset adhesives. This allows modules to be constructed having tighter dimensional tolerances, and consequently permits the fabrication of higher order (greater number of layers) modules.

The fused multilayer high-density microelectronic modules of the present invention have greater mechanical strength; higher stiffness; less outgassing; and better chemical and solvent resistance than prior art modules. They consequently have a substantially longer performance life and higher reliability.

It is understood that the exemplary fused high density multi-layer integrated circuit module of the present invention described herein and shown in the drawings represents only a presently preferred embodiment of the invention. Indeed, various modifications and additions may be made to such embodiment without departing from the spirit and scope of the invention. For example, the present invention need not be limited to use solely with infrared detector arrays which are bump bonded thereto, but rather may be used in any situation where it is necessary to connect a plurality of thin film substrates such that dimensional stability is achieved. Also, various physical configurations are contemplated, therefore the invention need not be limited to the generally rectangular shape as described and illustrated in the drawings. Thus, these and other modifications and additions may be obvious to those skilled in the art may be implemented to adapt the present invention for use in a variety of different applications.

What is claimed is:

1. A fused high density multi-layer integrated circuit module upon which thin-film microcircuits are formed, for integrating an infrared detector array to signal conditioning circuitry without the use of a buffer board, said module comprised of:
    (a) a plurality of thin substrate layers disposed in substantially overlapping registry to form a nonconductive supporting body;
    (b) a dielectric material layer disposed intermediate said substrate layers to bond adjacent substrate layers together, said dielectric material having a thermal coefficient of expansion of between 6.5 and 9 microns/meter/ degree centigrade and having a melting point of less than 800 degrees centigrade, such that the coefficient of expansion of said dielectric material layer is approximately equal to the thermal coefficient of expansion of said substrate layers;
    (c) wherein the use of a dielectric material having a thermal coefficient of expansion approximately equal to the thermal coefficient of expansion of said substrate layers reduces thermal stress such that the requirement for a buffer board is eliminated and the use of a dielectric material having a melting point of less than 800 degrees centigrade mitigates the possibility of damaging the thin-film microcircuits during the fusing process.

2. The fused high density multi-layer integrated circuit module as recited in claim 1 wherein said dielectric material is selected from the group consisting of:
    (a) lead-borosilicate glass;
    (b) glass-rich ceramics;
    (c) green ceramics; and
    (d) lead borate glass.

3. The fused high density multi-layer integrated circuit module as recited in claim 2 wherein said dielectric material comprises tape.

4. The fused high density multi-layer integrated circuit module as recited in claim 2 wherein said dielectric material comprises paste.

5. The fused high density multi-layer integrated circuit module as recited in claim 1 wherein the dielectric material is comprised of at least one of:
    (a) a lead-borosilicate glass frit having a thermal coefficient of expansion of approximately 7.0 microns/meter/degree centigrade; and
    (b) a high lead-borosilicate glass frit having a thermal coefficient of expansion of approximately 8.4 micron/meter/degree centigrade.

6. The fused high-density multi-layer integrated circuit module as recited in claim 5 wherein said substrate layers are comprised of an alumina ceramic material.

7. The fused high density multi-layer integrated circuit module as recited in claim 6 wherein said dielectric material has a melting point between 400-550 degrees centigrade.

* * * * *